(12) United States Patent
Ogawa

(10) Patent No.: US 8,963,910 B2
(45) Date of Patent: Feb. 24, 2015

(54) PIXEL INFORMATION MANAGEMENT APPARATUS AND IMAGE CAPTURE APPARATUS USING THE SAME

(71) Applicant: Canon Kabushiki Kaisha, Tokyo (JP)

(72) Inventor: Takeshi Ogawa, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 116 days.

(21) Appl. No.: 13/800,603

(22) Filed: Mar. 13, 2013

(65) Prior Publication Data

US 2013/0265295 A1 Oct. 10, 2013

(30) Foreign Application Priority Data

Apr. 6, 2012 (JP) .................................. 2012-087932
Jun. 5, 2012 (JP) .................................. 2012-128406

(51) Int. Cl.
*G06F 3/038* (2013.01)
*H04N 5/228* (2006.01)
*G09G 5/00* (2006.01)
*G09G 3/36* (2006.01)

(52) U.S. Cl.
CPC . *G09G 5/003* (2013.01); *G09G 3/36* (2013.01)
USPC .......... 345/214; 345/98; 345/618; 348/222.1; 348/241

(58) Field of Classification Search
None
See application file for complete search history.

(56) References Cited

U.S. PATENT DOCUMENTS

| 8,441,545 | B2* | 5/2013 | Hoda et al. ................. 348/222.1 |
| 2010/0245631 | A1 | 9/2010 | Hoda et al. |
| 2011/0037888 | A1 | 2/2011 | Onuki |
| 2012/0224087 | A1 | 9/2012 | Hoda et al. |

FOREIGN PATENT DOCUMENTS

| JP | 2009-163229 A | 7/2009 |
| JP | 2009-217074 A | 9/2009 |
| JP | 2010-113162 A | 5/2010 |

* cited by examiner

*Primary Examiner* — Muhammad N Edun
(74) *Attorney, Agent, or Firm* — Fitzpatrick, Cella, Harper & Scinto

(57) ABSTRACT

The present invention relates to a pixel information management apparatus that is capable of efficiently storing information on defective pixels of imaging pixels and information on evaluation pixels in the same format. Pixel information having a region that contains information indicating whether the pixel is a defective pixel of the imaging pixels or an evaluation pixel, a region that contains information that depends on whether the pixel is a defective pixel of the imaging pixels or an evaluation pixel, and a region that contains information for specifying a position of the pixel is stored, and a relative distance from another defective pixel of the imaging pixels or another evaluation pixel is stored as the information for specifying the pixel position, the relative distance being a distance that conforms to a predetermined pixel scan rule.

18 Claims, 8 Drawing Sheets

FIG. 5A

| ID (501) | OPERAND (502) | POSITION INFORMATION (503) |
|---|---|---|

FIG. 5B

| FOCUS DETECTION ID | OPENING ID | RELATIVE DISTANCE FROM IMMEDIATELY PREVIOUS DEFECTIVE PIXEL/FOCUS DETECTION PIXEL |
|---|---|---|

FIG. 5C

| DEFECT TYPE ID | DEFECT LEVEL | RELATIVE DISTANCE FROM IMMEDIATELY PREVIOUS DEFECTIVE PIXEL/FOCUS DETECTION PIXEL |
|---|---|---|

FIG. 5D

| DUMMY ID | NOT USED | RELATIVE DISTANCE FROM IMMEDIATELY PREVIOUS DEFECTIVE PIXEL/FOCUS DETECTION PIXEL |
|---|---|---|

(COMMON)

PIXEL INFORMATION MANAGEMENT APPARATUS AND IMAGE CAPTURE APPARATUS USING THE SAME

BACKGROUND OF THE INVENTION

1. Field of the Invention

The present invention relates to a pixel information management apparatus and an image capture apparatus using the same. In particular, the present invention relates to a technique of efficiently managing information about pixels included in an image sensor (pixel information), and a technique for processing signals using the pixel information.

2. Description of the Related Art

Conventionally, image sensors have been proposed that are capable of acquiring both phase-difference-detection-type focus detection signals and image capture signals, by forming some of the pixels as pupil-divided focus detection pixels. Focus detection pixels are special pixels having a partial light-shielding layer between a microlens and a photoelectric conversion unit. It is possible to form focus detection pixels whose pupil region where the photoelectric conversion unit receives light is different by changing the layout of the light-shielding layer, and to detect the amount and direction of defocus based on the shift amount and the shift direction in a pair of image signals (also referred to as "A image" and "B image") formed based on the outputs of the same type of focus detection pixels.

With such an image sensor, it is necessary to distinguish whether a pixel signal output from the image sensor is the output of a focus detection pixel or the output of an imaging pixel to process the signals. Specifically, it is necessary to form an image signal for focus detection with regard to the output of a focus detection pixel, and to interpolate an image capture signal for the position of the focus detection pixel with regard to the output of an imaging pixel. It is possible to distinguish between the output of focus detection pixels and the output of imaging pixels by storing the positions of the focus detection pixels in a non-volatile memory in advance.

Note that it is conventionally known that the position of a defective pixel included in the image sensor is stored in advance and an image capture signal for the position of the defective pixel is interpolated. Since image capture signals for the position of the focus detection pixel can be similarly interpolated, it is not necessary to change the method for processing signals even in the case where an image sensor having focus detection pixels is used, as long as information on the position of the focus detection pixels as well as the position of the defective pixels is stored.

Meanwhile, there have been various proposals since focus detection accuracy is influenced by how the focus detection pixels are laid out or what type of focus detection pixels are laid out.

For example, Japanese Patent Laid-Open No. 2009-217074 discloses a technique for improving focus detection performance by using focus detection pixels that have different pupil division directions and devising a method for laying out the focus detection pixels.

Also, Japanese Patent Laid-Open No. 2010-113162 discloses that, even in the case where the center of the optical axis of the microlens shifts due to manufacturing error, good focus detection accuracy is realized by laying out, in the image sensor, focus detection pixels that have five types of openings, with the center of a pupil for performing pupil division being shifted slightly to the left or right.

In the case where a configuration including all the different types of openings disclosed in Japanese Patent Laid-Open No. 2009-217074 and Japanese Patent Laid-Open No. 2010-113162 is adopted, there are five types of opening positions for each of four directions (i.e. vertical, horizontal, and two diagonal directions), and a further two types of opening positions for the shift direction are also required in order to generate a pair of image signals (A image and B image). As a result, 4 directions×5 opening positions×2 shift directions of the opening positions (for A image and B image), i.e. 40 types of the focus detection pixels in total are dispersedly laid out.

In this way, in the case where there are various types of focus detection pixels, the amount of information that needs to be stored in advance will increase because it is necessary to process output signals according to type. For example, Japanese Patent Laid-Open No. 2009-163229 discloses that correction information is stored that includes pixel addresses, which is information indicating the position of pixels for performing correction, pupil division direction bits, AB bits, focus detection pixel bits, and defect bits. Both information on defective pixels and information on focus detection pixels are stored in the correction information by using the focus detection pixel bits and the defect bits.

Also, the issue of how to store the pixel information in advance is not limited to focus detection pixels, and similar issues are conceivable for the pixel information of an image sensor having pixels other than imaging pixels.

SUMMARY OF THE INVENTION

The present invention has been achieved in view of such issues with the conventional technology. The present invention provides a pixel information management apparatus capable of efficiently storing information on a defective pixel of imaging pixels and information on an evaluation pixel in the same format, and an image capture apparatus using the pixel information management apparatus.

According to one aspect of the present invention, there is provided a pixel information management apparatus that stores information on a defective pixel of imaging pixels and information on an evaluation pixel, among pixels included in an image sensor, the apparatus storing, for each defective pixel of the imaging pixels and each evaluation pixel, pixel information that has, as respectively different regions: an ID region that contains information indicating whether the pixel is a defective pixel of the imaging pixels or an evaluation pixel; an operand region that contains information that depends on whether the pixel is a defective pixel of the imaging pixels or an evaluation pixel; and a position information region that contains information for specifying a position of the pixel, wherein the position information region stores a relative distance from another defective pixel of the imaging pixels or another evaluation pixel, as the information for specifying the pixel position.

According to another aspect of the present invention, there is provided an image capture apparatus including an image sensor having imaging pixels and an evaluation pixel, and a pixel information management apparatus that stores, for each defective pixel of the imaging pixels and each evaluation pixel, pixel information that has, as respectively different regions, an ID region that contains information indicating whether the pixel is a defective pixel of the imaging pixels or an evaluation pixel, an operand region that contains information that depends on whether the pixel is a defective pixel of the imaging pixels or an evaluation pixel, and a position information region that contains information for specifying a position of the pixel, the image capture apparatus comprising: a unit that determines an evaluation pixel included in the image sensor using, out of the pixel information, pixel information in which information indicating the evaluation pixel is contained in the ID region, and for generating an image signal for phase-difference detection type focus detection from a signal output from the evaluation pixel; and a unit that generates a signal for a position of a defective pixel of the imaging pixels or an evaluation pixel by interpolation using, out of the pixel information, pixel information in which information indicating the defective pixel of the imaging pixels or the evaluation pixel is contained in the ID region.

Further features of the present invention will become apparent from the following description of exemplary embodiments with reference to the attached drawings.

BRIEF DESCRIPTION OF THE DRAWINGS

FIGS. 5A to 5D are diagrams showing examples of the configuration of pixel information in an embodiment of the present invention.

DESCRIPTION OF THE EMBODIMENTS

Exemplary embodiments of the present invention will now be described in detail in accordance with the accompanying drawings.

First Embodiment

Figure 1:
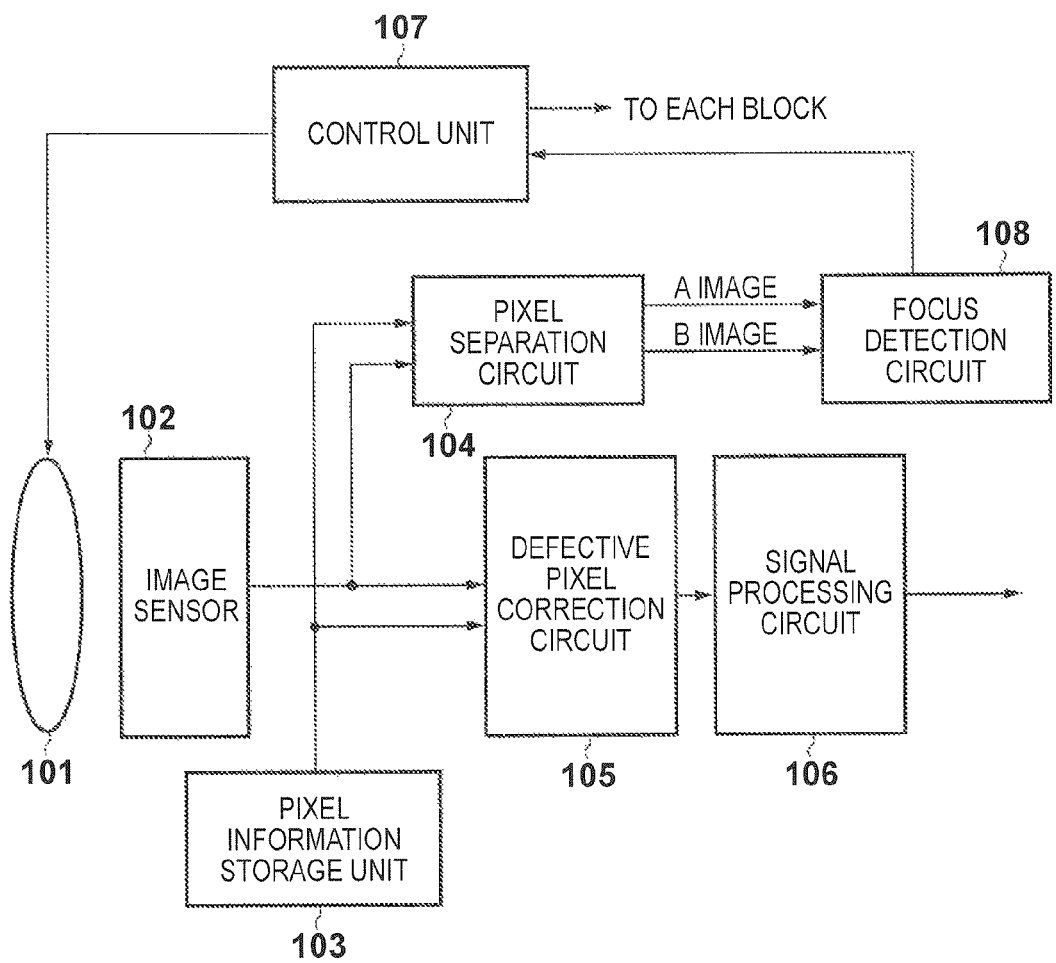
FIG. 1 is a block diagram showing an example of a functional configuration of a digital camera serving as one example of an apparatus to which a pixel information management apparatus according to a first embodiment of the present invention is applicable.

FIG. 1 is a block diagram showing an example of the functional configuration of a digital camera serving as one example of an apparatus to which a pixel information management apparatus according to a first embodiment of the present invention is applicable.

An image capture lens 101 has a focus lens that is driven in accordance with the control of a control unit 107, and forms an object image on the image capture plane of an image sensor 102. The image sensor 102 is a photoelectric conversion sensor such as a CCD image sensor or a CMOS image sensor, and a plurality of pixels are laid out thereon. The image sensor 102 has imaging pixels and focus detection pixels. A pixel information storage unit 103 that is one form of a pixel information management apparatus stores position information on defective pixels and focus detection pixels. Note that both imaging pixels and focus detection pixels may be defective pixels. A pixel separation circuit 104 generates a pair of image signals (A image signal and B image signal) for focus detection from signals output from the focus detection pixels among signals output from the image sensor 102.

A defective pixel correction circuit 105 generates signals for the positions of defective pixels of the imaging pixels and the focus detection pixels by interpolation. Note that the defective pixel correction circuit 105 directly outputs signals output from the imaging pixels that are not defective pixels. A signal processing circuit 106 generates color image signals from signals output from the image sensor 102 that are generated after interpolation of defective pixels. A focus detection circuit 108 calculates the direction and amount of defocus (since the direction can be represented by a symbol, for example, both the defocus direction and the defocus amount are collectively referred to as the "defocus amount" hereinafter) based on the direction and amount of shift in the pair of the image signals that are output from the pixel separation circuit 104. The control unit 107 drives a focusing lens of the image capture lens 101 in accordance with the defocus amount detected by the focus detection circuit 108. The control unit 107 also controls the overall operations of the digital camera. The control unit 107 has a CPU, a ROM, and a RAM, for example, and is capable of realizing the operations of the digital camera that will be described later by deploying programs stored in the ROM in the RAM and by the CPU executing the deployed programs.

Figure 2:
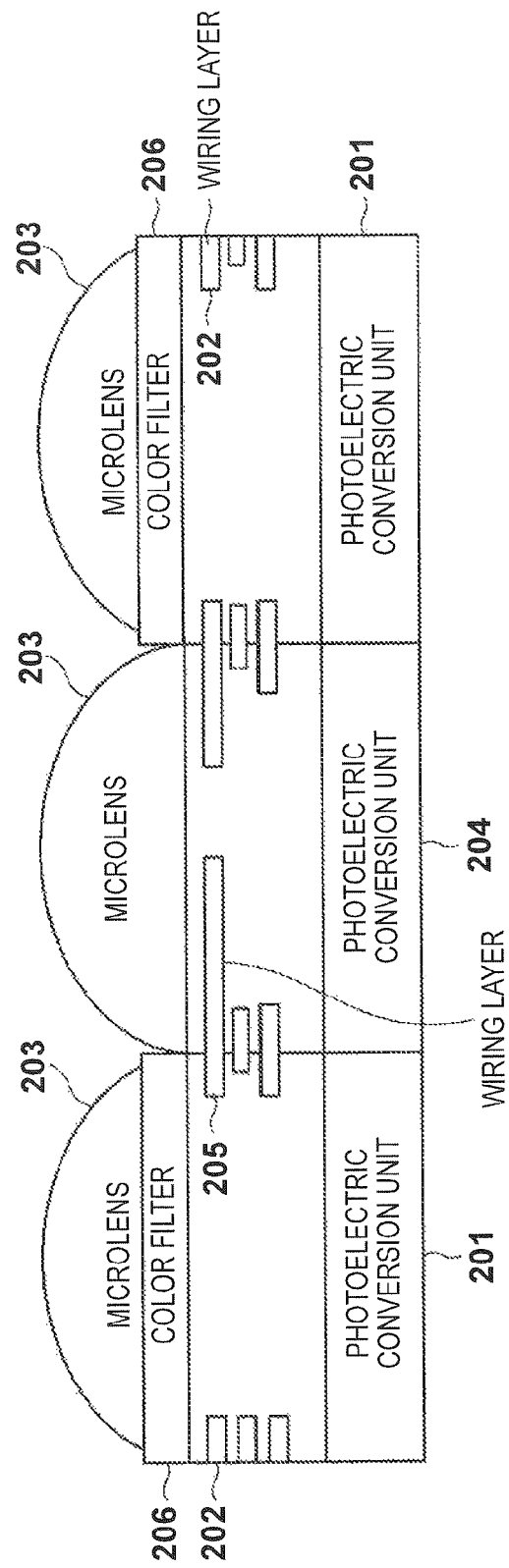
FIG. 2 is a vertical cross-sectional view showing an example of the structures of imaging pixels and focus detection pixels.

FIG. 2 is a vertical cross-sectional view showing an example of the structures of pixels in the image sensor 102. FIG. 2 shows three successive pixels, and the center pixel is a focus detection pixel and the right and left pixels are imaging pixels. Each pixel has a photoelectric conversion unit 201 or 204, a microlens 203, and wiring layers 202 and 205. Meanwhile, a color filter is not provided in the focus detection pixel, and the focus detection pixel has a function of dividing a pupil by limiting light flux incident on the photoelectric conversion unit 204 using the wiring layer 205. In this way, the wiring layer 205 in the focus detection pixel functions as an opening mechanism in the pixel. It is possible to change a pupil region through which the light flux incident on the photoelectric conversion unit 204 passes by changing the position of an opening portion formed by the wiring layer 205. Therefore, in the case where the pupil is divided in a horizontal direction, at least two types of focus detection pixels in which the horizontal positions of the opening portions formed by the wiring layer 205 are different are formed.

Figure 3:
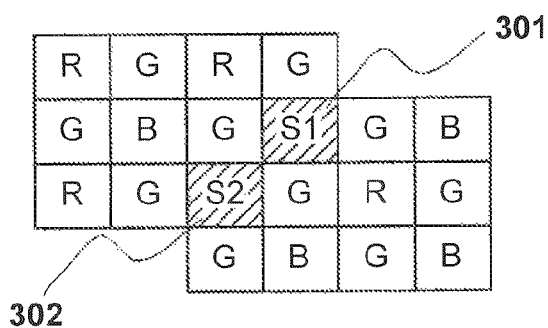
FIG. 3 is a diagram showing an example of the layouts of focus detection pixels and imaging pixels.

FIG. 3 is a diagram schematically showing an example of the layout of focus detection pixels in an image sensor that includes a Bayer array of primary color filters. In the Bayer array, RGB pixels are regularly laid out with two-by-two pixels as one unit. In the example of FIG. 3, a focus detection pixel S1 301 and a focus detection pixel S2 302 are laid out in the position of an R pixel and the position of a B pixel that are included in one unit of the Bayer array that exists in the center. In the case where pupil division is performed with the focus detection pixels S1 and S2 in the horizontal direction, the wiring layer 205 is formed such that the horizontal positions of the openings included in the focus detection pixels S1 and S2 are different.

As described above, output values of an R pixel and a B pixel that should be acquired at the positions of the focus detection pixels 301 and 302 are generated in the defective pixel correction circuit 105 by interpolation.

Figure 4:
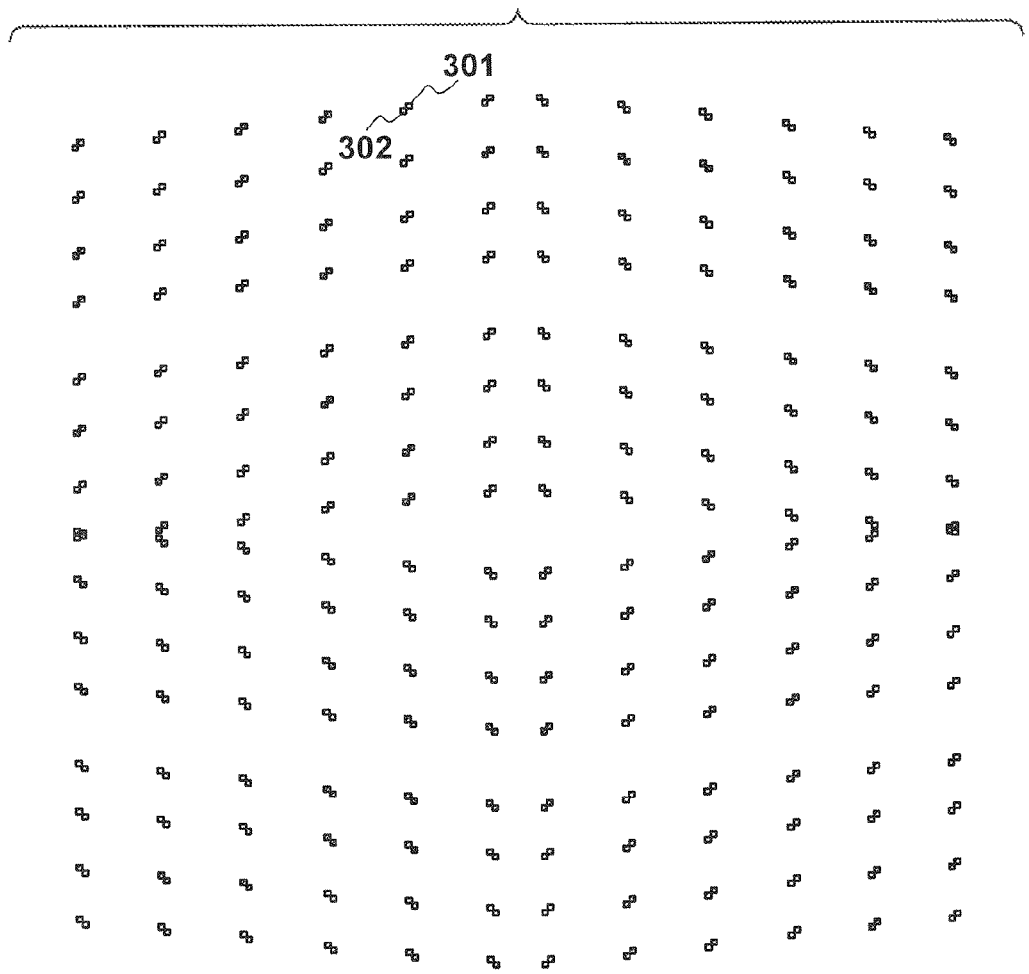
FIG. 4 is a diagram showing an example of the layout of focus detection pixels.

FIG. 4 schematically shows an example of the layout of the focus detection pixels in the image sensor 102. In order to generate the pair of the image signals required for performing phase-difference detection type focus detection, a plurality of pairs of focus detection pixels similar to the focus detection pixels S1 301 and S2 302 are required. Also, the plurality of pairs of the focus detection pixels are discretely laid out over the entire image sensor 102 so as to perform focus detection at a plurality of positions on the screen.

Also, although focus detection on an object having a luminance distribution in a horizontal direction of the image capture screen, such as on a vertical line, for example, is possible from the pair of the image signals acquired from the pair of the focus detection pixels whose pupils are divided in the horizontal direction, focus detection on an object having a luminance distribution in the vertical direction, such as on a horizontal line, for example, is not possible. Thus, pairs of the focus detection pixels having different pupil division directions (vertical direction, 45° diagonal direction, or 135° direction, for example) are also discretely laid out on the entire image sensor 102.

As described above, focus detection pixels whose opening positions are changed taking shift in the optical axis of the microlens into consideration are similarly provided, and consequently a large number of different types of pairs of the focus detection pixels are discretely laid out on the entire image sensor 102. Also, as shown in FIG. 4, the layout of the pairs of the focus detection pixels is apparently irregular, rather than uniform.

FIGS. 5A to 5D are diagrams schematically showing examples of pixel information stored in the pixel information storage unit 103 and the data structures thereof. As shown in FIG. 5A, one piece of pixel information has an ID region 501, an operand region 502, and a position information region 503 that respectively have a fixed number of bits, regardless of the type of pixel. Note that the order in which these pieces of information are contained is not limited to the order shown in FIG. 5A. The pixel information storage unit 103 is a set of data (record) in the format shown in FIG. 5A, and may be handled as an array.

Here, storing information on the above described forty types of the focus detection pixels, like with Japanese Patent Laid-Open No. 2009-163229, requires a total 8 bits consisting of a defect bit (1), a focus detection pixel bit (1), an AB bit (1), a pupil division direction bit (2) and an opening position (3) (the numbers in the parentheses ( ) indicate the minimum number of bits considered to be required). Additionally, in the case of the image sensor having 4000 horizontal by 3000 vertical pixels (12,000,000 pixels), 12 bits are required for both the vertical direction and the horizontal direction in order to express the pixel addresses with two dimensional coordinates, and thus 30 bits are required in order to store information on one defective pixel or one focus detection pixel. However, with regard to a defective pixel of the imaging pixels, only the 1 bit of the defect bit is required when the pixel address is excluded, and 7 bits are wasted. Thus, the utilization efficiency of a memory for storing the information is low.

In order to improve the utilization efficiency of the memory, it is conceivable that information on a defective pixel of the imaging pixels is stored in a format different from that of the focus detection pixels, such as in a different table, for example. However, in the case where a plurality of different tables are used, it is necessary to also change the content of processing that uses the information, in accordance with the type of table. Also, assuming that processing is performed while pixel outputs are being scanned, looking up the plurality of tables for one pixel address leads to a drop in processing efficiency.

In view of this, the present embodiment is characterized in that information on a defective pixel of the imaging pixels and information on the focus detection pixels are stored as single pixel information files in the same format.

Information indicating whether the pixel is a focus detection pixel or a defective pixel of the imaging pixels, and in the case of a defective pixel, information indicating the type of defective pixel are contained in the ID region 501. The type of defective pixel may indicate the method for correcting the defect, for example, and types of defects include those corrected by gain correction, interpolation using surrounding pixels, offset correction and the like.

Also, a dummy ID may be contained in the ID region 501 (FIG. 5D). The meaning of the dummy ID and the method of using the dummy ID will be described later.

Information that varies depending on the content of the ID region 501 is contained in the operand region 502. For example, in the case where the ID region 501 indicates a focus detection pixel, information that specifies the type of openings (opening ID) may be contained (FIG. 5B). Also, in the case where the ID region 501 indicates a defective pixel, information that indicates the level of defect may be contained, for example (FIG. 5C).

Information that specifies the position of pixels is contained in the position information region 503. Position information of a pixel is assumed to be information on a relative distance (number of pixels) from another defective pixel or focus detection pixel, rather than being information on an absolute position (XY coordinates, for example). In this way, as compared with the case where the absolute position information is stored, it is possible to reduce the number of bits required for the position information region 503 by storing the position information using the relative distance from the position of another defective pixel. Note that it is possible to store a plurality of pieces of pixel information for the same pixel (for example, information as a focus detection pixel and information as a defective pixel) by letting the relative distance be 0.

Note that the relative distance is a distance that conforms to a predetermined pixel scan rule, and is not always the shortest distance. For example, in the case of a rule for scanning one line of pixels from left to right from the pixel in the upper left corner of the image sensor, and then scanning from left to right from the pixel at the left end of the next line, the positions in the horizontal direction are equal, and the distance between pixels adjacent in the vertical direction is equal to one (horizontal) line of pixels. Note that the position information for the first defective pixel or the first focus detection pixel in the scan rule contains the relative distance from the 0-th pixel. It is possible to readout and use pixel information in order by storing the pixel information in accordance with the order of defective pixels or focus detection pixels that appear in accordance with the scan rule.

For example, in the case where the image sensor 102 has 4000 horizontal by 3000 vertical pixels, 12 bits are required for the horizontal (X) coordinate and the vertical (Y) coordinate respectively in order to express the position of a pixel with absolute coordinates, thus requiring 24 bits in total.

On the other hand, in the case where the relative distance between pixels is used, the distance for 65000 pixels can be expressed only with 16 bits. Because the probability of occurrence of a defective pixel is approximately 1/64000 pixels on average, the distance can be sufficiently expressed thereby. Also, in the present embodiment, since focus detection pixels are discretely laid out besides defective pixels, 16 bits are considered to be sufficient in most cases.

However, there is a possibility of cases in which the relative distance is longer than the number of pixels that can be expressed by 16 bits. Thus, in the present embodiment, a dummy ID is used in order to deal with a relative distance that exceeds the number of pixels that can be expressed by the number of bits allocated to the position information region 503. In the case where a dummy ID is contained in the ID region 501, the information in the position information region 503 is only used for counting down by a position information processing circuit 603, and the pixel corresponding to the value contained in the position information region 503 is not treated as a defective pixel or a focus detection pixel.

Specifically, with regard to pixel information containing the dummy ID, the value in the position information region 503 is only counted down, and other processing is not performed. Accordingly, the relative distance can be expressed by the sum of the value of the position information region 503 of the pixel information containing the dummy ID and the value of the position information region 503 of the next piece of pixel information. The pixel information having the dummy ID may be repeatedly used. Accordingly, it is possible to deal with a very long relative distance that may infrequently occur. Therefore, a configuration is adopted such that in the case where the relative distance cannot be handled with the number of bits of the position information region 503 when storing pixel information, the relative distance is expressed by the sum of the position information of pixel information that contains the dummy ID and the position information of the subsequent piece of pixel information that does not contain the dummy ID.

Figure 6:
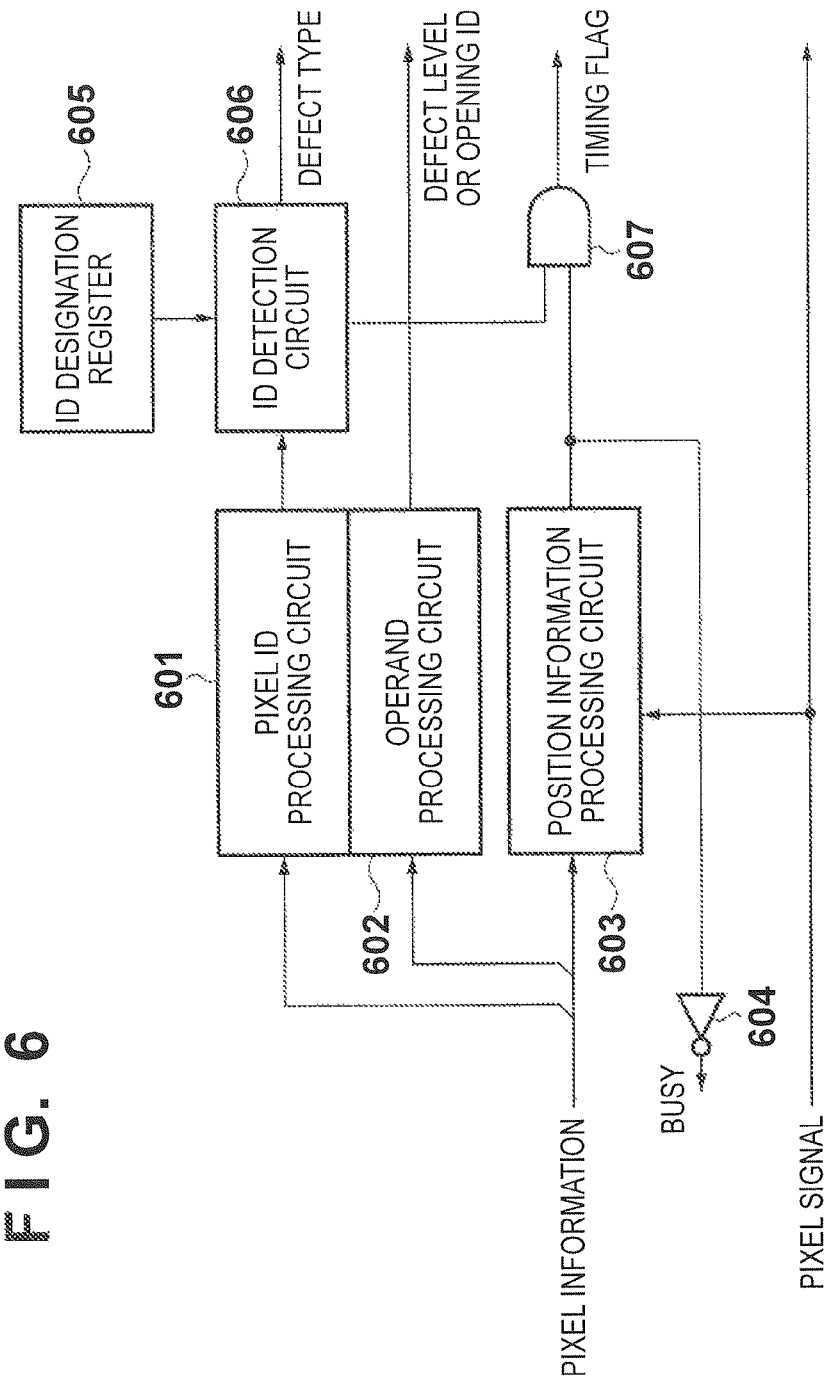
FIG. 6 is a block diagram showing an example of the configuration of a circuit that acquires and generates necessary information from pixel information in an embodiment of the present invention.

FIG. 6 is a block diagram showing an example of the configuration of a circuit that acquires necessary information from pixel information stored in the pixel information storage unit 103 and generates the information in the pixel separation circuit 104 and the defective pixel correction circuit 105.

The pixel information is readout from the pixel information storage unit 103, and the ID region 501, the operand region 502, and the position information region 503 are respectively loaded on a pixel ID processing circuit 601, an operand processing circuit 602, and the position information processing circuit 603. Here, as described above, the position information is a value indicating the relative distance (number of pixels) from another defective pixel or focus detection pixel.

The position information processing circuit 603 has a down-counter and performs count-down each time a pixel signal is processed. The position information processing circuit 603 outputs "0" until the value of the down-counter reaches 0. This output is output as a BUSY signal having the value "1" through an inverter 604, and prohibits loading of the next piece of pixel information. When the value of the down-counter reaches 0, the output from the position information processing circuit 603 will be "1". Accordingly, the value of the BUSY signal will be "0" output through the inverter 604, and loading of the next piece of pixel information is permitted.

While the position information processing circuit 603 is counting down, the pixel ID processing circuit 601 holds a pixel ID. An ID detection circuit 606 then determines whether or not the held pixel ID is a pixel ID that is designated in an ID designation register 605. The ID designation register 605 is provided in order for the control unit 107 to designate types of pixels to be processed in the defective pixel correction circuit 105 and the pixel separation circuit 104.

If the pixel ID held in the pixel ID processing circuit 601 is a pixel ID designated in the ID designation register 605, the ID detection circuit 606 outputs a signal having the value "1" to an AND gate 607, and in other cases (including the case where the held pixel ID is the dummy ID), outputs a signal having the value "0" and to AND gate 607. The AND gate 607 outputs, as a timing flag (defect flag indicating the defective pixel and the focus detection pixel to be processed), a logical AND of the output from the ID detection circuit 606 and the output from the position information processing circuit 603. Also, if the pixel ID is the information indicating a type of defect, the ID detection circuit 606 outputs the information on the type.

The control unit 107 designates only a focus detection pixel ID in the ID designation register 605 of the pixel separation circuit 104. The pixel separation circuit 104 handles the information of the operand region 502 that is output from the operand processing circuit 602 as classification information that specifies types of focus detection pixels, such as A image, B image, pupil division in the vertical direction, pupil division in the horizontal direction, and the like.

The pixel separation circuit 104 judges the type of the focus detection pixels based on the opening ID contained in the operand region 502, and generates the A image and the B image based on signals output from the same type of the focus detection pixels for the A image and the focus detection pixels for the B image. Then, the focus detection circuit 108 calculates a defocus amount based on the shift amount and direction of the A image and the B image. Note that if there are a plurality of pupil division directions for the focus detection pixels, the pixel separation circuit 104 generates the A image and the B image for each pupil division direction.

Meanwhile, the control unit 107 adds a defect type ID to the ID designation register 605 of the defective pixel correction circuit 105, and also designates the focus detection pixel ID as pixels to be processed. Accordingly, in the defective pixel correction circuit 105, pixel interpolation processing is applied to both the imaging pixels and the focus detection pixels. Note that interpolation processing on the focus detection pixels and interpolation processing on a defective pixel of the imaging pixels may be the same, or may alternatively be different. With regard to a defective pixel of the imaging pixels, interpolation processing may be performed in accordance with the type and level of defect.

Because the dummy ID is not designated in the ID designation register 605 even in the defective pixel correction circuit 105 or the pixel separation circuit 104, the dummy ID does not influence the type of defective pixel output from the ID detection circuit 606.

In this way, by adopting a configuration in which pixel information having an ID that is not designated in the ID designation register is not processed, it is possible to easily realize the introduction of a new ID and the addition of a circuit that performs processing on the new ID. For example, in the case where infrared pixels are discretely laid out and an infrared pixel processing circuit is added, pixel information having IDs of the infrared pixels needs to be added and the infrared pixel IDs also need to be designated in the ID designation register 605 of the infrared pixel processing circuit. Because the infrared pixel IDs ignored in the pixel separation circuit 104 and the defective pixel correction circuit 105, the processing is not influenced.

As described above, according to the present embodiment, because information on the defective pixel of the imaging pixels and information on the focus detection pixels are collectively managed so that information about type and level of defect can be included with regard to the defective pixel of the imaging pixels, it is possible to perform fine interpolation processing. Also, it is possible to reduce the amount of information required for pixel information and improve utilization efficiency of a memory by using the relative distance from another imaging pixel and focus detection pixel as information for specifying the position of a pixel.

Also, by processing circuits for defective pixels and focus detection pixels being configured to process only pixels corresponding to the pixel information having a designated ID, it is possible to add new types of pixels and processing circuits without influencing processing of the existing processing circuits.

Second Embodiment

Figure 7:
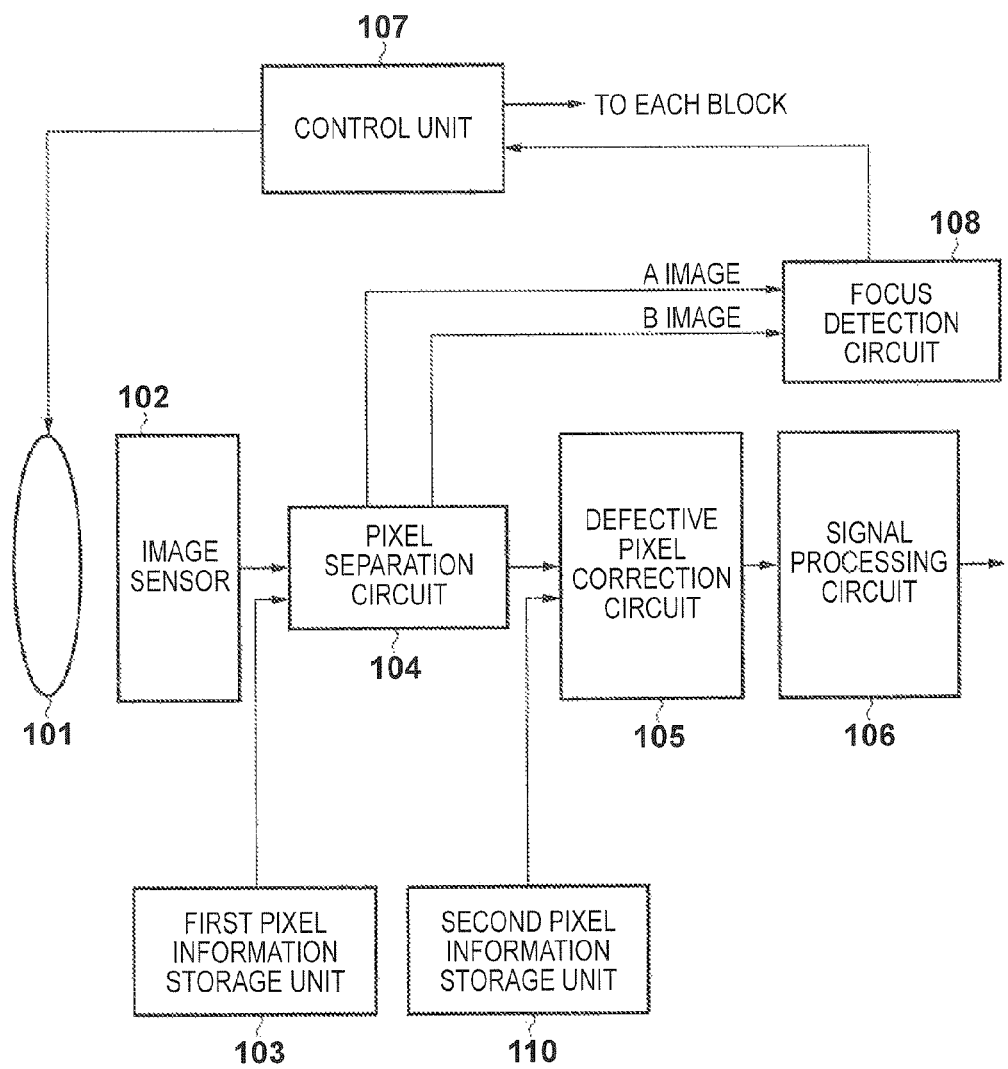
FIG. 7 is a block diagram showing an example of the functional configuration of a digital camera according to a second embodiment of the present invention.

Next, a second embodiment of the present invention will be described, with reference to FIG. 7. Similarly to the first embodiment, the present embodiment is described using a digital camera to which a pixel information storage apparatus according to the present invention is applied as an example. In FIG. 7, the same reference numerals as in FIG. 1 are given to configurations similar to those in the first embodiment.

In the first embodiment, a configuration was adopted in which the defective pixel correction circuit 105 and the pixel separation circuit 104 are connected in parallel to the pixel information storage unit 103. In contrast, in the present embodiment, the pixel separation circuit 104 and the defective pixel correction circuit 105 are wired in series, and a second pixel information storage unit 109 is added, in addition to the first pixel information storage unit 103 in which pixel information similar to that in the pixel information storage unit in the first embodiment is stored. The second pixel information storage unit 109 stores pixel information that is different from the pixel information stored in the first pixel information storage unit 109.

The pixel separation circuit 104 supplies the outputs from imaging pixels directly to the defective pixel correction circuit 105, and with regard to focus detection pixels, the pixel separation circuit 104 replaces the outputs from focus detection pixels with a special value to supply these outputs to the defective pixel correction circuit 105. The defective pixel correction circuit 105 judges the output from focus detection pixels based on the value output from the pixel separation circuit 104, and targets the output for interpolation processing. The special value indicating output from a focus detection pixel is a value in a region whose gradation is not considered important to the image, such as zero or the like. In the case where there is an imaging pixel having the value of zero, the value is replaced with 1 for example and is then output.

Although information on defective pixels detected at the time of manufacture of the image sensor is stored in the first pixel information storage unit 103, there is a case where a pixel that was considered to be normal at the time of manufacture becomes a defective pixel due to age-related deterioration or the like. Thus, in the present embodiment, the second pixel information storage unit 109 is added in order to store pixel information on defective pixels that have increased in number due to age-related deterioration after the pixel information was stored in the first pixel information storage unit 103. The information can be added to the second pixel information storage unit 109 at any timing, such as when a pixel newly determined to be a defective pixel is found by performing processing for detecting defective pixels at the time of starting the apparatus, for example.

The defective pixel correction circuit 105 processes the pixel information stored in the second pixel information storage unit 109 in the circuits shown in FIG. 6, similarly to the first embodiment. In addition to the above, interpolation processing is performed on pixels whose pixel signal value is the special value. The type of interpolation processing performed on the pixels whose pixel signal value is a special value is arbitrary.

It is necessary to notify the defective pixel correction circuit 105 of the defective pixels occurring at the time of manufacture. Thus, in the present embodiment, defective pixels are also stored in the first pixel information storage unit 103 as focus detection pixels. Note that a special value is designated for the opening ID of the defective pixel so that the pixel separation circuit 104 does not process that pixel as a focus detection pixel. In the case where the opening ID includes the special value, the pixel separation circuit 104 determines the corresponding pixel to be the defective pixel, replaces the output value with a special value (zero), and supplies the value to the defective pixel correction circuit 105.

According to the present embodiment, the defective pixel that occurs due to age-related deterioration can also be targeted for interpolation processing.

Third Embodiment

Figure 8:
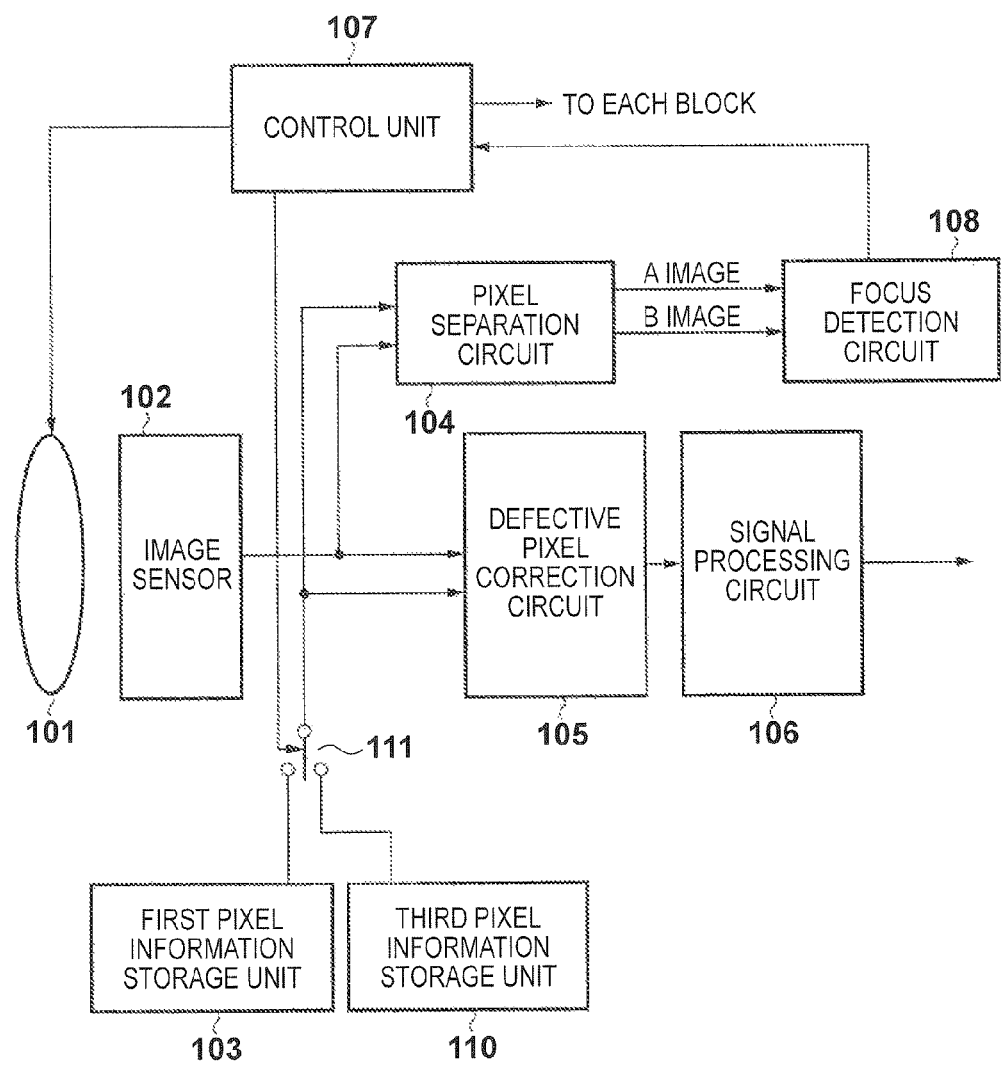
FIG. 8 is a block diagram showing an example of the functional configuration of a digital camera according to a third embodiment of the present invention.

Next, a third embodiment of the present invention will be described, with reference to FIG. 8. Similarly to the first embodiment, the present embodiment is described using a digital camera to which a pixel information storage apparatus according to the present invention is applied as an example. In FIG. 8, the same reference numerals as in FIG. 1 are given to configurations similar to those in the first embodiment.

In the present embodiment, a third pixel information storage unit 110 is added in addition to the first pixel information storage unit 103 corresponding to the pixel information storage unit. Also, a switch 111 is provided so as to selectively connect either the first pixel information storage unit 103 or the third pixel information storage unit 110 with the pixel separation circuit 104 and the defective pixel correction circuit 105 according to control of the control unit 107.

There is a case where the image sensor 102 has a plurality of reading modes. For example, in addition to a mode in which all the pixels are read out, a mode in which pixels are thinned out and then read out, a mode in which pixels are added and then read out, and the like.

In the case of performing thinning out or addition, the number of pixels is different from that in the case where all pixels are read out. In the case where the number of pixels varies depending on a reading mode in this way, it is necessary to use the relative distance corresponding to a reading mode also for the position information included in the pixel information.

In the present embodiment, in the case where there are two numbers of pixels to be read out in correspondence in the reading mode, a pixel information storage unit storing the pixel information having a pixel position corresponding to the readout pixel number is prepared, and the control unit 107 appropriately switches the switch 111 on/off in accordance with the reading mode. For example, the first pixel information storage unit 103 stores pixel information corresponding to the mode in which all the pixels are read out, and the third pixel information storage unit 110 stores pixel information corresponding to the mode in which a specified number of pixels that is less than all the pixels are read out such as the thinning/reading mode or the adding/reading mode.

Note that FIG. 8 shows the configuration in which the first pixel information storage unit 103 and the third pixel information storage unit 110 are physically different storage units, and the connection is switched with the switch 111. However, a configuration may be adopted in which the first pixel information storage unit 103 and the third pixel information storage unit 110 are implemented as different address spaces in the same storage apparatus.

Fourth Embodiment

Next, a fourth embodiment of the present invention will be described, with reference to FIGS. 9A and 9B. Similarly to the third embodiment, the present embodiment is described using a digital camera to which a pixel information storage apparatus according to the present invention is applied as an example.

Figure 9A:
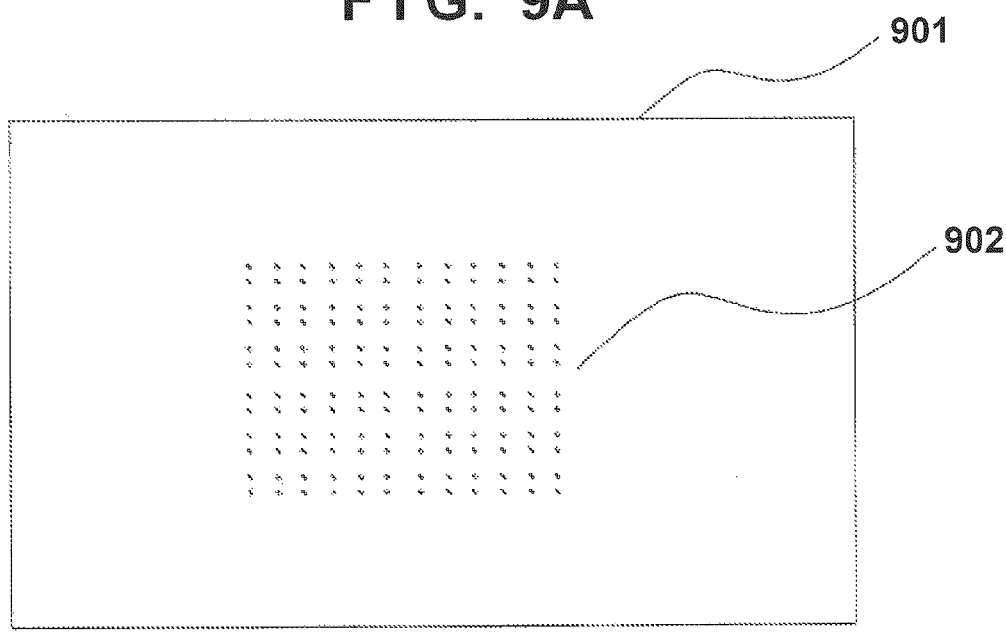
FIG. 9A is a diagram showing an example of the layout of focus detection pixels in a fourth embodiment of the present invention.
Figure 9B:
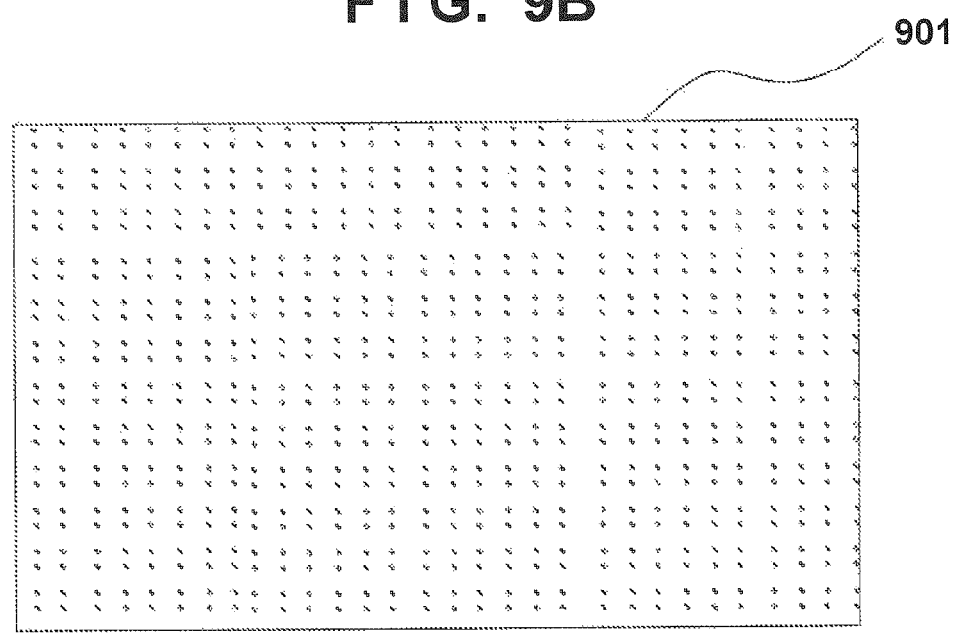
FIG. 9B is a diagram showing an example of the layouts of focus detection pixels and defective pixels in the fourth embodiment of the present invention.

FIGS. 9A and 9B schematically show another example of the layout of the focus detection pixels in image sensor 102. Reference numeral 901 indicates an overall region in which pixels are laid out in the image sensor 102 and the focus detection pixels are laid out only in a central portion indicated by reference numeral 902 in the example of FIG. 9A. Laying out of the focus detection pixels in a partial region of the image sensor, particularly only in the central portion, is often carried out in the case where a main object is in the central portion of a visual field to be captured or when limiting the layout range of the focus detection pixels reduces the design limitations on the image sensor. The digital camera including the image sensor in which the focus detection pixels are laid out as shown in FIG. 9A is configured to detect focal points for the object in the central portion of the visual field.

Although the thinning/reading mode or an adding/reading mode described in the third embodiment is a mode for use with a viewfinder when capturing images or with moving image capture, if pixels are laid out such that the density of the focus detection pixels increases, the focus detection accuracy increases in such a mode.

On the other hand, if the layout density of the focus detection pixels is increased in a given pixel region, the layout density of the imaging pixels decreases in that region, and thus image quality decreases. As a specific example, when an object having a repetitive pattern is captured, a spatial frequency of the repetitive pattern and a spatial frequency of the layout of the focus detection pixels interfere with each other, resulting in generation of a low pseudo-frequency component. Although such a low frequency component is also generated by thinning/reading, the low frequency component generated by thinning/reading is not noticeable because it is uniformly generated over the entire region in which pixels of the image sensor are laid out. However, in the case where the layout density of the focus detection pixels varies depending on a region, a low frequency component to be generated in a high layout density region is different from that in a low layout density region. Because the focus detection pixels are laid out only in the central portion of the region in which pixels of the image sensor are laid out in the example of FIG. 9A, a low pseudo-frequency component is generated more in the central portion than in the other region, leading to strong visual unnaturalness.

In the present embodiment, it is assumed that the focus detection pixels are laid out in the partial region of the image sensor and there are defective pixels in the same layout density as that of the focus detection pixels in a region in which the focus detection pixels are not laid out in the thinning/reading mode. Referring to the example of FIG. 9A, the second pixel information storage unit 109 is prepared that has stored pixel information indicating that there are defective pixels in the same layout density as that of the focus detection pixels (and with the same layout rule) for at least a part of regions other than the partial region indicated by reference numeral 902. Then, when in the thinning/reading mode in the case where the focus detection pixels are laid out in a partial region of the image sensor, pixel information for the thinning/reading mode is looked up in the second pixel information storage unit 109.

Accordingly, it is possible to reduce or resolve the difference in the low frequency components generated in the region where the focus detection pixels are laid out and in the region where the focus detection pixels are not laid out, and to reduce or resolve visual unnaturalness. FIG. 9B shows an example of the layouts of the defective pixels and the focus detection pixels in thinning/reading mode. In FIG. 9B, similarly to FIG. 9A, the focus detection pixels are laid out only in the central portion and the defective pixels are laid out in the other region.

Note that as in the case where all the pixels are read out to record a still image, in the case where the density of the focus detection pixels is sufficiently lower than in thinning/reading mode, even if only the region in which the focus detection pixels are laid out is corrected, the corrected region is not visually noticeable. Thus, it is possible to correct the defective pixels only in the region for which correction is required as necessary without laying out defective pixels for the region in which focus detection pixels are not laid out.

The present embodiment is capable of dealing with a case where there are reading modes in which the number of pixels to be read out varies.

In the above-described embodiments, examples are described in which the focus detection pixels are arranged in accordance with a predetermined rule as pixels included in the image sensor, separately from the imaging pixels. However, the present invention is not limited to this, and it is possible to use the pixel information of the present invention in order to specify the positions and the characteristics of evaluation pixels that are arranged for evaluation, separately from the imaging pixels, i.e. pixels for outputting images for ordinary viewing. It is assumed that some types of correction that are different from the correction on the imaging pixels or interpolation with use of peripheral imaging pixels are performed using this pixel information at a position at which the evaluation pixels are arranged in order to output images for viewing. Examples of the evaluation pixels includes light measurement pixels with a different sensor size or a different or no color filter from that for the imaging pixels in order to measure light and light shielding pixels that reduce light, as compared with the imaging pixels, with at least a filter, a mask, or the like in order to determine characteristics in the case of shielding light. Also, because pixels that are handled as focus detection pixels in the present embodiment enable the object distance that represents a distance in a direction of a depth by a phase difference to be calculated, it is possible to treat these pixels as distance measurement pixels. In this way, the type of pixels that are arranged in accordance with a predetermined rule on the image sensor and that are used for a plurality of evaluations may be stored in the ID region, for example, and these pixels may be stored in the pixel information as the evaluation pixels.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-087932 filed on Apr. 6, 2012 and 2012-128406 filed on Jun. 5, 2012, which are hereby incorporated by reference herein their entirety.

What is claimed is:

1. A pixel information management apparatus that stores information on a defective pixel of imaging pixels and information on an evaluation pixel, among pixels included in an image sensor,
the apparatus storing, for each defective pixel of the imaging pixels and each evaluation pixel, pixel information that has, as respectively different regions:
an ID region that contains information indicating whether the pixel is a defective pixel of the imaging pixels or an evaluation pixel;
an operand region that contains information that depends on whether the pixel is a defective pixel of the imaging pixels or an evaluation pixel; and
a position information region that contains information for specifying a position of the pixel,
wherein the position information region stores a relative distance from another defective pixel of the imaging pixels or another evaluation pixel, as the information for specifying the pixel position.

2. The pixel information management apparatus according to claim 1, wherein the ID region, the operand region, and the position information region each have a fixed number of bits.

3. The pixel information management apparatus according to claim 1, wherein the evaluation pixels are laid out in the image sensor in accordance with a predetermined rule.

4. The pixel information management apparatus according to claim 1, wherein a relative distance that exceeds the relative distance from another defective pixel of the imaging pixels or another evaluation pixel, which can be expressed by the number of bits of the position information region, is expressed using the information for specifying the pixel position that is contained in the position information region of a plurality of pieces of pixel information, including pixel information that contains information that does not indicate an evaluation pixel or an imaging pixel in the ID region.

5. The pixel information management apparatus according to claim 1, wherein the information indicating whether the pixel is a defective pixel of the imaging pixels or an evaluation pixel includes information indicating a type of defective pixel.

6. The pixel information management apparatus according to claim 1, wherein the information that depends on whether the pixel is a defective pixel of the imaging pixels or an evaluation pixel includes information indicating a defect level with regard to the defective pixel of the imaging pixels, and includes a type of evaluation pixel with regard to the evaluation pixel.

7. The pixel information management apparatus according to claim 1, further comprising a region for storing the pixel information at the time of manufacture of the image sensor and a region for storing pixel information on additional defective pixels.

8. The pixel information management apparatus according to claim 1,
wherein the image sensor has a plurality of reading modes that differ in the number of pixels to be read out, and
wherein the pixel information management apparatus stores, for each defective pixel of the imaging pixels and each evaluation pixel, a plurality of pieces of pixel information that each contain the information for specifying the pixel position and that correspond to the number of pixels to be read out from the position information region.

9. The pixel information management apparatus according to claim 8, wherein in a case where the evaluation pixels are laid out in a partial region of the image sensor and the image sensor has a thinning/reading mode, the pixel information management apparatus stores pixel information indicating that the defective pixels of the imaging pixels exist at the same layout density as the evaluation pixels in a region other than the partial region of the image sensor, as the pixel information corresponding to the thinning/reading mode.

10. An image capture apparatus including an image sensor having imaging pixels and at least one evaluation pixel, and a pixel information management apparatus that stores, for each defective pixel of the imaging pixels and each evaluation pixel, pixel information that has, as respectively different regions, an ID region that contains information indicating whether the pixel is a defective pixel of the imaging pixels or an evaluation pixel, an operand region that contains information that depends on whether the pixel is a defective pixel of the imaging pixels or an evaluation pixel, and a position information region that contains information for specifying a position of the pixel, the image capture apparatus comprising:
a unit that determines an evaluation pixel included in the image sensor using, out of the pixel information, pixel information in which information indicating the evaluation pixel is contained in the ID region, and that generates an image signal for phase-difference detection type focus detection from a signal output from the evaluation pixel; and
a unit that generates a signal for a position of a defective pixel of the imaging pixels or the evaluation pixel by interpolation using, out of the pixel information, pixel information in which information indicating the defective pixel of the imaging pixels or the evaluation pixel is contained in the ID region.

11. The image capture apparatus according to claim 10, wherein the ID region, the operand region, and the position information region each have a fixed number of bits.

12. The image capture apparatus according to claim 10, wherein the evaluation pixels are laid out in accordance with a predetermined rule.

13. The image capture apparatus according to claim 10,
wherein a relative distance that exceeds the relative distance that can be expressed by the number of bits of the position information region is expressed using the information for specifying the pixel position that is contained in the position information region of a plurality of pieces of pixel information, including pixel information that contains information that does not indicate an evaluation pixel or an imaging pixel in the ID region.

14. The image capture apparatus according to claim 10, wherein the information indicating whether the pixel is a defective pixel of the imaging pixels or an evaluation pixel includes information indicating a type of defective pixel.

15. The image capture apparatus according to claim 10, wherein the information that depends on whether the pixel is a defective pixel of the imaging pixels or an evaluation pixel includes information indicating a defect level with regard to the defective pixel of the imaging pixels, and includes a type of evaluation pixel with regard to the evaluation pixel.

16. The image capture apparatus according to claim 10, having a region for storing the pixel information at the time of manufacture of the image sensor and a region for storing pixel information on additional defective pixels.

17. The image capture apparatus according to claim 10, wherein the image sensor has a plurality of reading modes that differ in the number of pixels to be read out, and
the pixel information management apparatus has, for each defective pixel of the imaging pixels and each evaluation pixel, a plurality of pieces of pixel information that each contain the information for specifying the pixel position and that correspond to the number of pixels to be read out from the position information region.

18. The image capture apparatus according to claim 17, wherein in a case where the evaluation pixels are laid out in a partial region of the image sensor and the image sensor has a thinning/reading mode, the pixel information management apparatus has pixel information indicating that the defective pixels of the imaging pixels exist at the same layout density as that of the evaluation pixels in a region other than the partial region of the image sensor, as the pixel information corresponding to the thinning/reading mode.

* * * * *